United States Patent
Togashi et al.

(10) Patent No.: US 7,147,710 B2
(45) Date of Patent: Dec. 12, 2006

(54) METHOD OF MANUFACTURING EPITAXIAL SILICON WAFER

(75) Inventors: Kazuya Togashi, Kanagawa (JP); Masayoshi Danbata, Kanagawa (JP); Kuniaki Arai, Kanagawa (JP); Kaori Matsumoto, Kanagawa (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 53 days.

(21) Appl. No.: 10/298,740

(22) Filed: Nov. 18, 2002

(65) Prior Publication Data

US 2003/0068502 A1    Apr. 10, 2003

Related U.S. Application Data

(62) Division of application No. 09/650,802, filed on Aug. 30, 2000, now abandoned.

(30) Foreign Application Priority Data

Aug. 30, 1999   (JP)   ................... 11-244097

(51) Int. Cl.
*C30B 15/04*   (2006.01)
(52) U.S. Cl. ............... 117/13; 117/14; 117/15; 117/20; 117/945
(58) Field of Classification Search .......... 117/13, 117/14, 15, 20, 945
See application file for complete search history.

(56) References Cited

U.S. PATENT DOCUMENTS 5,567,399 A    10/1996   Von Ammon et al.
6,056,931 A    5/2000    Saishoji et al.
6,273,944 B1   8/2001    Saishoji et al.
6,334,896 B1 * 1/2002    Iida et al. ............. 117/20
6,348,261 B1   2/2002    Murakami
6,551,398 B1 * 4/2003    Abe et al. ............. 117/3

FOREIGN PATENT DOCUMENTS

| JP | 239291/1996 | 9/1996 |
|---|---|---|
| JP | 08330316 | 12/1996 |
| JP | 10209053 | 7/1998 |
| JP | 10209054 | 7/1998 |
| JP | 10209055 | 7/1998 |
| JP | 10209056 | 7/1998 |
| JP | 10209057 | 7/1998 |

OTHER PUBLICATIONS

M. Kimura et al., Journal of the Japanese Association for Crystal Growth, vol. 24, No. 5, pp. 444-448 (1997).
S.M. Hourai et al., Journal of the Japanese Association for Crystal Growth, vol. 25, No. 5, pp. 207-213 (1998).

* cited by examiner

*Primary Examiner*—Robert Kunemund
(74) *Attorney, Agent, or Firm*—Welsh & Katz, Ltd.

(57) ABSTRACT

There is described a method which enables stable manufacture of a high-quality, ultra-thin epitaxial silicon wafer, as well as an epitaxial silicon wafer capable of bearing shipment manufactured by the method. A method of manufacturing an epitaxial silicon wafer having an ultra-thin epitaxial film, by means of forming an epitaxial film on a silicon wafer after having annealed the silicon wafer, includes the steps of: sufficiently smoothing COPs formed in the surface of the silicon wafer by means of appropriately setting annealing conditions according to an size of COPs in the vicinity of a surface of the silicon wafer; and forming an epitaxial film through epitaxial growth.

22 Claims, 9 Drawing Sheets

FIG.1 A
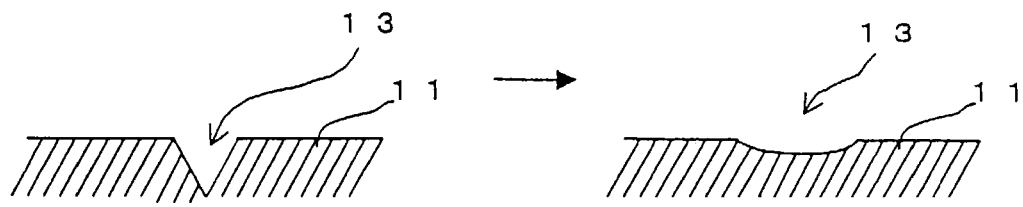
FIG.1 B
FIG.2 A
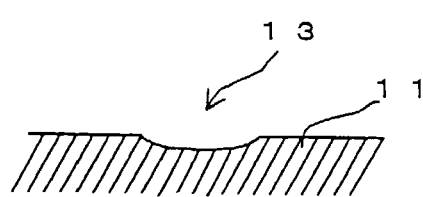
FIG.2 B
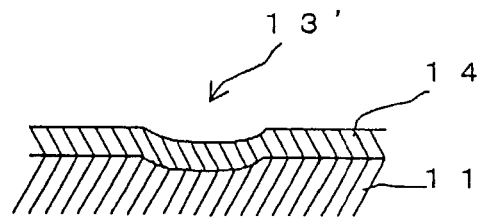
FIG.2 C
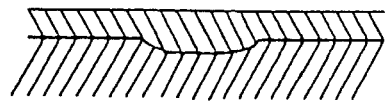

METHOD OF MANUFACTURING EPITAXIAL SILICON WAFER

This application is a divisional of U.S. patent application Ser. No. 09/650,802 filed Aug. 30, 2000 now abandoned.

BACKGROUND OF THE INVENTION

1. Field of the Invention

The present invention relates to a method of manufacturing an epitaxial silicon wafer by subjecting a silicon wafer to epitaxial growth (silicon wafer as a silicon substrate for epitaxial growth) after having annealed the silicon wafer, as well as to an epitaxial silicon wafer which is manufactured by the method and is capable of bearing shipment.

2. Background Art

A silicon wafer which is sliced off a silicon ingot produced by the Czochralski method (i.e., hereinafter referred to simply as a "CZ silicon ingot") is mirror-polished and is subjected to an ammonia-based cleaning operation. Crystal Originated particles (COPs) are detected using Particle Counter on Silicon wafer surface as LPDs. From the time of their discovery, COPs have been considered to be extraneous matter and have been called "particles." However, as shown in FIG. 1A, COPs are said to be octahedral void-like defects and are known to arise in the surface of a silicon wafer 11 in the form of a recessed pit 13.

COPs impair the electrical characteristics of a silicon wafer, which in turn results in a reduction in the manufacturing yield of a silicon wafer. In order to prevent such a problem, a silicon wafer is usually produced while requirements are set so as to reduce occurrence of COPs from the beginning, or COPs which have arisen in a silicon wafer are disappeared.

It has been reported that COPs can be disappeared by means of effecting predetermined epitaxial growth under appropriate conditions ["Behavior of COP pits during Si-Epitaxial Growth,"Masataka KIMURA et al., Journal of the Japan Associate of Crystal Growth Vol. 1.24, No. 5, pp. 444 to 448 (1997)]. It has also been reported that an $H_2$ annealing operation is effected during epitaxial growth (see the above paper by Masataka KIMURA et al. and Japanese Patent Laid-Open Nos. 209053/1998 through 209057/1998). An $H_2$ annealing is commonly performed for producing a denuded zone (DZ) layer on the silicon wafer surface. As shown in FIGS. 1A and 1B, a deep, angular pit is converted to a shallow, wide, and round pit (transition from the pit shown in FIG. 1A to the pit shown in FIG. 1B).

Against this backdrop, the paper by Masataka KIMURA et al indicates that COPs cannot be disappeared by means of $H_2$ annealing and still remain thereafter in another form, and that atmospheric pressure epitaxy is anisotropic and low-pressure epitaxy is isotropic. COPs remain after low-pressure epitaxy but are disappeared by means of atmospheric-pressure epitaxy.

As shown in FIGS. 2A through 2C, an epitaxial layer 14 grows so as to follow the contour of the surface of a silicon wafer 11, which wafer serves as a substrate (see FIGS. 2A and 2B). Therefore, depending on growth conditions, a recess 13 formed in the surface of the silicon wafer 11 is transferred to the surface of the epitaxial layer 14 [more specifically, an imperfection (a light point defect: LPD) 13' arises in the surface of the epitaxial layer 13 as a result of transfer of a COP 13].

However, it has also been reported that, as shown by transition from FIG. 2A to FIG. 2C, occurrence of an LPD 13', which would otherwise be caused by the influence of a COP, can be prevented by means of imparting sufficient thickness to an epitaxial layer or by means of appropriately setting requirements for epitaxial growth (as described in, for example, Japanese Patent Laid-Open No. 209053/1998).

Japanese Patent Laid-Open Nos. 209053/1998 through 209057/1998 described a method of eliminating the effect of COPs on wafer surface through low-pressure epitaxial growth. It is stated that elimination of COPs involves a necessity of growing an epitaxial layer to a thickness of 4 μm or more. These patents state that a silicon wafer having $1\times10^5$ $COPs/cm^3$ or less is suitable as a silicon wafer to be used for epitaxial growth (as described in Japanese Patent Laid-Open No. 209056/1998). In a case where an epitaxial layer is formed on a silicon wafer as a silicon substrate for epitaxial growth, satisfying the requirement at reduced pressure, there can be produced an epitaxial silicon wafer capable of being handled as a product (more specifically, there can be produced an epitaxial silicon wafer having an LPD density of 0.3 defects/$cm^3$ or less).

The background technology is in principle aimed at eliminating recesses from the silicon wafer surface, by means of growing a comparatively-thick epitaxial layer. More specifically, the present invention has been conceived on the basis of a generally-known phenomenon that COPs become less likely to arise in the surface of an epitaxial layer when the epitaxial layer is formed on the silicon wafer surface to a thickness of 2 μm or more through atmospheric-pressure epitaxial growth.

The background technology has failed to manufacture an extremely-thin epitaxial silicon wafer (more specifically, having a thickness of 0.4 μm or less) which is acceptable as a product.

The foregoing references state that the influence of COPs is eliminated so long as an epitaxial layer of 0.4 μm or more is formed through atmospheric epitaxial growth, but does not refer to the temperature or duration of an $H_2$ baking operation. Further, the foregoing references states only an LSTD (laser scattering tomography defects) density of $1\times10^5$ or less in terms of a certain limited phenomenal theory. It is well known that COPs formed in a silicon wafer surface degrade gate oxide integrity (GOI). With regard to a thickness to which an epitaxial film is to be grown in order to sufficiently improve gate oxide integrity, the references fail to describe a measured value of epitaxial film. Thus, in terms of disclosure of information about practicing an invention, the background technology poses a problem.

At the time of filing of the patent applications relating to the above-described techniques, the smallest sized COP which a particle counter could detect was 0.13 μm. In contrast, a current particle counter can detect a COP or LPD of 0.085 μm in size. Accordingly, there has emerged another problem which would arise within the range of disclosure of the background techniques.

The present invention has been conceived to solve the foregoing drawback in the art, and the object of the present invention is to provide a method which enables stable manufacture of a high-quality, ultra-thin epitaxial silicon wafer, as well as an epitaxial silicon wafer capable of bearing shipment manufactured by the method.

SUMMARY OF THE INVENTION

As a result of considerable studies conducted by the inventors of the present invention in order to achieve the above object, the inventors have found that, contrary to disclosures of patents of the background technology, a crystal having small-sized COPs; for example, a crystal having a high LSTD density formed through high-speed pulling growth, is in practice suitable as a silicon wafer for epitaxial growth in a case where the silicon wafer is annealed before an epitaxial layer is formed thereon.

More specifically, the present invention provides a method of manufacturing an epitaxial wafer manufactured by the method, as will be described below.

(1) A method of manufacturing an epitaxial silicon wafer by means of producing an epitaxial wafer on a silicon wafer as a silicon substrate for epitaxial growth after the silicon wafer for epitaxial growth has been annealed, wherein an ultra-thin epitaxial film is formed after the shape of COPs, which are present in the surface of the silicon wafer for epitaxial growth has been sufficiently smoothed, by means of appropriately setting annealing requirements according to an LSTD density in the vicinity of the surface of the silicon wafer for epitaxial growth.

Preferably, a silicon wafer having a high LSTD density in the surface thereof (i.e., having small-size COPs) is suitable as a silicon wafer as a silicon substrate for epitaxial growth. More specifically, a silicon wafer having an LSTD density of $1\times10^6$ defects/cm$^3$ or more is preferable. In a single crystal formed by means of the crystal growth technique, defects in the single crystal become smaller with an increase in the density of void type defect. In the present invention, a silicon wafer having smaller void type defects is preferable, and hence a silicon wafer having a greater LSTD density is desirable.

The expression "ultra thin" designates an ultra-thin epitaxial film which has quality sufficient for bearing shipment as an epitaxial silicon wafer for use in manufacturing a semiconductor device and which cannot be produced by the conventional epitaxial growth technique.

(2) Preferably, the LSTD density in the vicinity of the surface of the silicon wafer is $1\times10^6$ defects/cm$^3$ or more.

The expression "in the vicinity of a surface" signifies the silicon wafer surface and an area in the vicinity of the surface, the area affecting epitaxial growth.

(3) Preferably, COPs arising in the silicon wafer surface assume a size of 130 nm or less.

(4) Preferably, a silicon wafer is sliced off a silicon ingot, the ingot being manufactured by means of the Czochralski (CZ) method (CZ technique), high-speed pulling, rapid cooling of a pulled single crystal, doping a silicon ingot with nitrogen, or production of a perfect crystal.

The expression "rapid cooling" signifies the technique of forcefully cooling a single crystal currently being pulled through use of a cooler provided within, for example, a CZ furnace (see, for example, Japanese Patent Laid-Open No. 239291/1996). COPs can be made smaller by means of this technique. The expression "perfect crystal" signifies a crystal which does not include any grown-in defects (which interstitial type defects as dislocation clusters, vacancy type defects as void like defect or oxygen precipitates as OSF which usually arise in a crystal during growth of a single silicon crystal by use of the CZ method), which would otherwise be caused during growth [see, for example, the Journal of the Japanese Association for crystal Growth Vol. 25, No. 5 (1998), pg. 207, Japanese Patent Laid-Open No. 330316/1996]. In the case of a perfect crystal, an oxygen precipitate core is included in a crystal and increases in size as a result of a wafer being subjected to heat treatment. Finally, the oxygen precipitate core becomes a COP. The thus-formed COP is smaller than a common COP, and hence such a perfect crystal is suitable as a silicon wafer for use in producing an epitaxial wafer according to the present invention.

(5) The present invention provides an epitaxial silicon wafer comprising an ultra-thin epitaxial film having a gate oxide integrity (GOI) characteristic suitable for shipment and a thickness of 0.3 μm or thereabouts, and another epitaxial film laid on the ultra-thin epitaxial film. The expression "a GOI characteristic sufficient for shipment" means that an epitaxial silicon wafer has a characteristic sufficient for being acceptable in a common transaction, in comprehensive consideration of a high yield during fabrication of a semiconductor device, such as a MOS-FET. The expression is substantially synonymous with the expression that "an epitaxial silicon wafer having a level of quality sufficient for shipment."

(6) The present invention also a method of manufacturing an epitaxial silicon wafer, the method comprising a round of isothermal, isobaric annealing and epitaxial processes.

The "isothermal and isobaric" signify that temperatures and pressures used for the annealing and epitaxial processes are completely or substantially identical. More specifically, the present invention pays consideration in effecting an annealing operation and epitaxial growth incessantly through a round of processes. So long as a difference in temperature and pressure does not pose any difficulty in effecting an annealing operation and epitaxial growth through a round of processes, the difference falls within the range of the expression "isothermal and isobaric."

(7) Preferably, the expression "isothermal" signifies a temperature of 1100° or more, and the expression "isobaric" signifies atmospheric pressure. With regard to epitaxial growth, a preferable temperature may vary according to the type of gas used as raw material. In a case where a temperature is set to a value of 1100° C. or thereabouts, it may be better that epitaxial growth be effected through use of $SiHCl_3$ gas.

(8) Preferably, an epitaxial layer is grown through the round of annealing and epitaxial processes, by use of $SiHCl_3$ gas.

(9) The present invention provides a method of manufacturing an epitaxial silicon wafer, comprising:

a high-speed pulling silicon ingot manufacturing step of pulling a silicon ingot at high speed or rapidly cooling a pulled single crystal such that an LSTD density assumes a value of $1\times10^6$ defects/cm$^3$ or more;

a step of slicing a silicon wafer off a silicon ingot manufactured in the high-speed manufacturing step; and the round of annealing and epitaxial processes as defined previously.

As shown in FIG. 3, in a case where the annealing temperature is set so as to become equal to a temperature employed for epitaxial growth, there can be effected switching between an annealing operation and an epitaxial growth operation, by means of changing only the type of gas surrounding a wafer. Accordingly, the time required for increasing and decreasing a temperature can be saved, thereby shortening the time required for the complete manufacturing process.

A crystal having small COPs and a high LSTD density can be produced, by means of even a method which does not directly involve shortening of the manufacturing time required for, for example, doping with nitrogen. Further, a crystal having small COPs can also be produced by means of a method in which the time required for pulling single crystal is shortened as a result of high speed pulling of a single crystal or rapid cooling of the same. The manufacturing method according to the present invention has been conceived on the basis of this finding. Since the previously-described "round of annealing and epitaxial processes"

contribute to shortening of the time required for manufacturing processes, from among methods of manufacturing a crystal having a high LSTD density there is selected a manufacturing method which eventually involves shortening of a manufacturing time. Use of the thus-selected manufacturing method in combination with the "round of annealing and epitaxial processes" enables shortening of total time by a great amount.

[COPs of a Silicon Wafer and Heat Treatment Thereof]

In a case where an epitaxial film has a thickness of less than 2.4 μm, the profile of recessed COPs formed on the silicon wafer surfaces is touched off a chain to surface on epitaxial film. In the epitaxial film, there is an appearance of COPs formed in the surface of the silicon wafer as a substrate for epitaxial growth. The appearance is closely related to conditions for $H_2$ baking before epitaxial growth, as well as to the sizes of COPs arising in a silicon wafer. Some of the background art techniques state that the profile of COPs does not affect an epitaxial film so long as an epitaxial film is grown to a thickness of 1 μm. In effect, the profile of COPs will affect an epitaxial layer according to conditions for $H_2$ baking.

In the $H_2$ baking process, COPs are converted into gently-sloped, shallow, and wide recesses. During a $H_2$ baking ($H_2$ processing) operation which is performed for a short period of time during the process of manufacturing an epitaxial silicon wafer, the smaller COPs become, the shallower the shape COPs can assume under the same heat treatment conditions. Further, a higher temperature is desirable for $H_2$ baking. As a matter of course, a shallower pit is preferable during the subsequent epitaxial layer growth step for filling in the pit. A flat epitaxial silicon wafer without pits which include influence of COPs can be manufactured by means of a high-speed pulling operation. A crystal produced by means of high-speed pulling is suitable as a silicon substrate for epitaxial growth.

This overturns the concept of a crystal produced by means of a high-speed pulling operation (i.e., there has been apprehension that a crystal produced by means of a high-speed pulling operation has a high density of void-like defects and, hence, is unsuitable as a silicon wafer for producing an epitaxial wafer). Thus, the present invention provides a new application of a crystal manufactured through a high-speed pulling operation.

[Numerical Values Used Herein]

Unless otherwise specified, any numerical value used herein (for example, the size of COP) designates an average.

BRIEF DESCRIPTION OF THE DRAWINGS

FIGS. 1A and 1B are schematic representations for describing the behaviors of COPs when a silicon wafer is subjected to an $H_2$ annealing operation;

FIGS. 2A through 2C are schematic representations for describing the behaviors when an epitaxial film is formed on a silicon wafer through epitaxial growth;

BEST MODE FOR CARRYING OUT THE INVENTION

A silicon wafer—which has been sliced off a silicon ingot pulled by means of the CZ technique and subjected to mirror polishing—is hereinbelow taken as a silicon wafer as a silicon substrate for epitaxial growth. The following embodiment describes a case where the silicon wafer for epitaxial growth is subjected to an $H_2$ annealing operation and epitaxial growth under predetermined conditions.

The silicon wafer has a diameter of 200 mm, and an epitaxial film was produced at 1100° C. through use of $SiHCl_3$ gas. A silicon wafer, which was used in the embodiment and produced through a medium-speed pulling operation, has an LSTD density of about $2\times10^5$ defects/cm$^3$ (measured by MO-601) and a COP size of about 170 nm (measured by MO-401). A silicon wafer, which was used in the embodiment and produced through a high-speed pulling operation, has an LSTD density of about $2\times10^6$ defects/cm$^3$ (measured by MO-601) and a COP size of about 130 nm (measured by MO-401).

Figure 3:
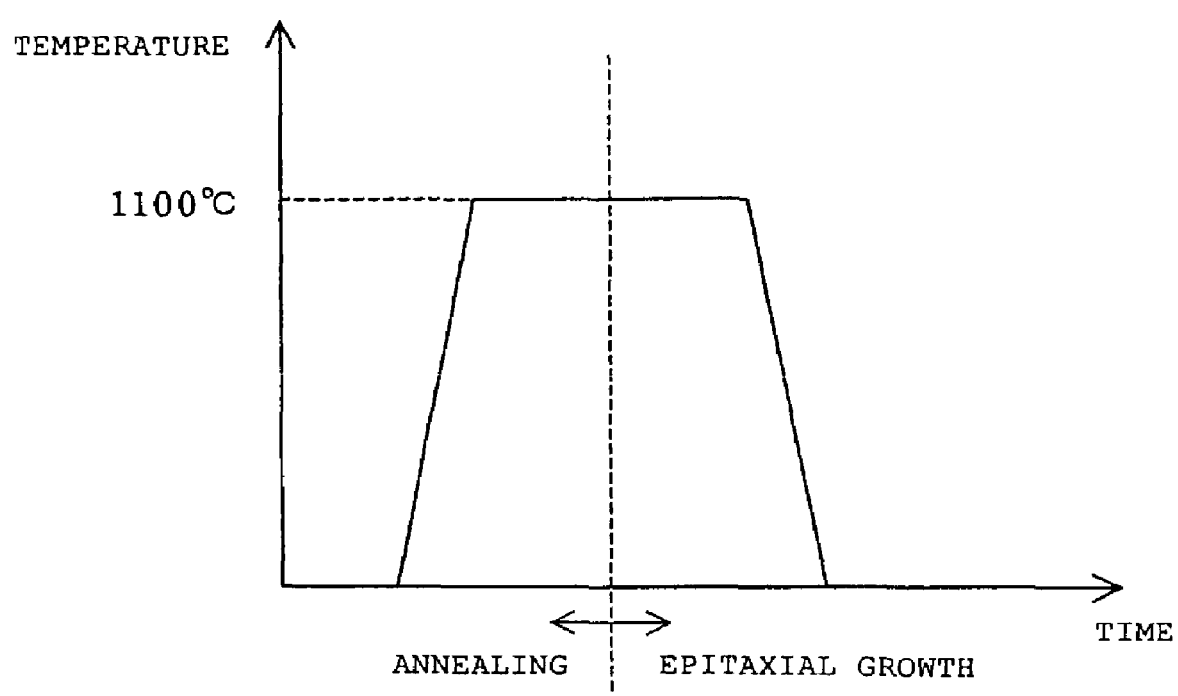
FIG. 3 is a graph for describing a round of annealing and epitaxial processes according to the present invention.
Figure 4:
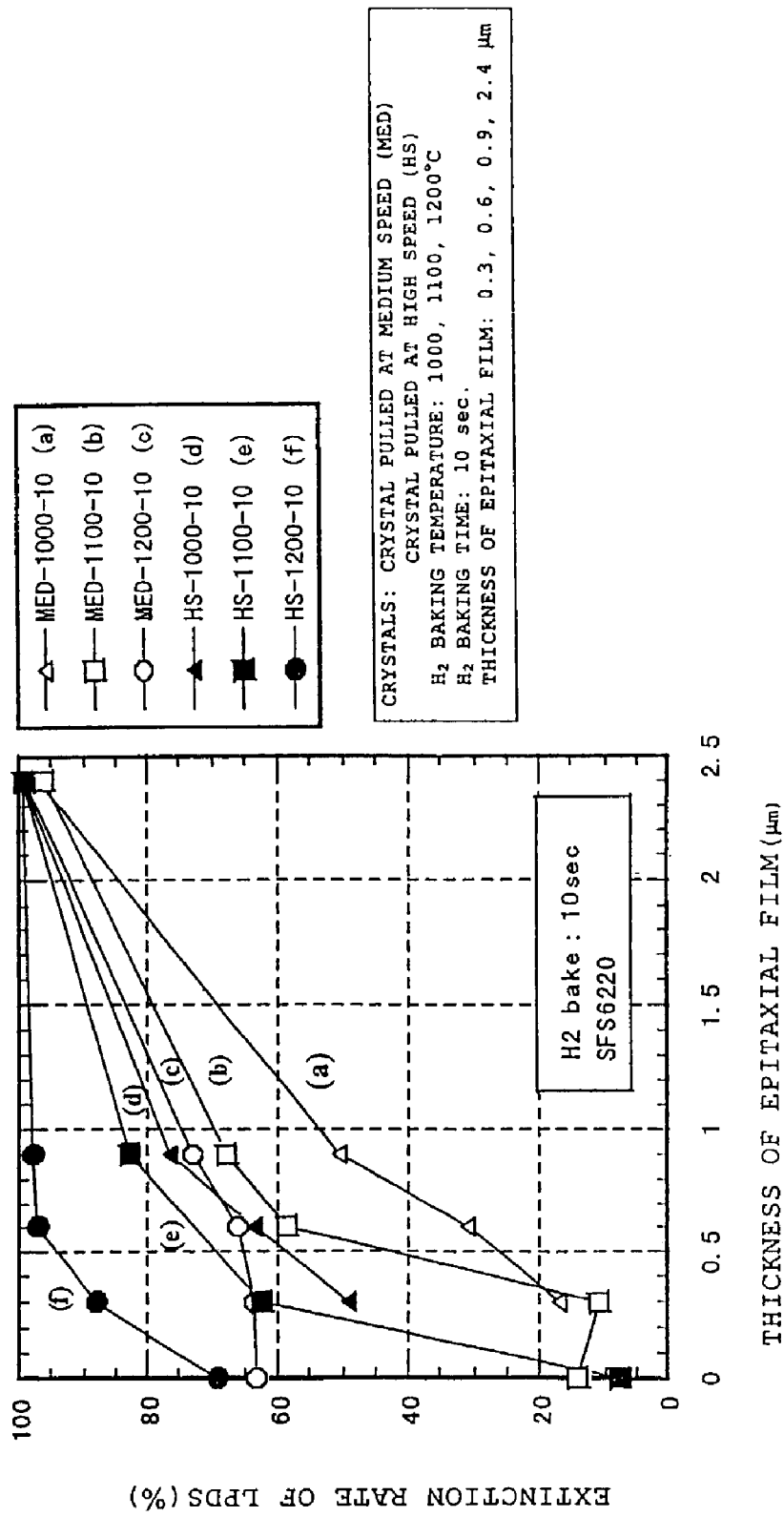
FIG. 4 is a graph showing variation in the extinction rate of LPDs, the variation being induced by a difference in requirements for $H_2$ annealing before epitaxial growth (with a constant processing time of 10 seconds) and a difference between crystals.

FIG. 4 is a graph showing the relationship between the thickness of an epitaxial film and the extinction rate of LPDs. The graph shows the extinction rate of LPDs performed while an $H_2$ annealing time was held constant at 10 seconds, the $H_2$ annealing temperature was varied within the range of 1000° C. to 1200° C., and the pulling speed of the crystal was varied between a medium speed (MED) and a high speed (HS). The extinction rate of LPDs was plotted for each of an epitaxial film of 0.3 μm thickness, an epitaxial film of 0.6 μm, an epitaxial film of 0.9 μm, and an epitaxial film of 2.4 μm [some cases employed an epitaxial film of 0 μm (i.e., a silicon wafer was subjected to only an $H_2$ annealing operation without involvement of epitaxial growth)]. The extinction rate of LPDs was measured through use of SFS6220 (KLA Tencor) while detection limit (D.L) was set to a value of 0.12 μm or less.

In a case where an $H_2$ annealing time is constant, it is seen from FIG. 4 that a crystal which is manufactured through a high-speed (HS) pulling operation and at a high temperature $H_2$ annealing shows a high extinction rate of LPDs, thus resulting in production of an epitaxial wafer of good quality.

Figure 5:
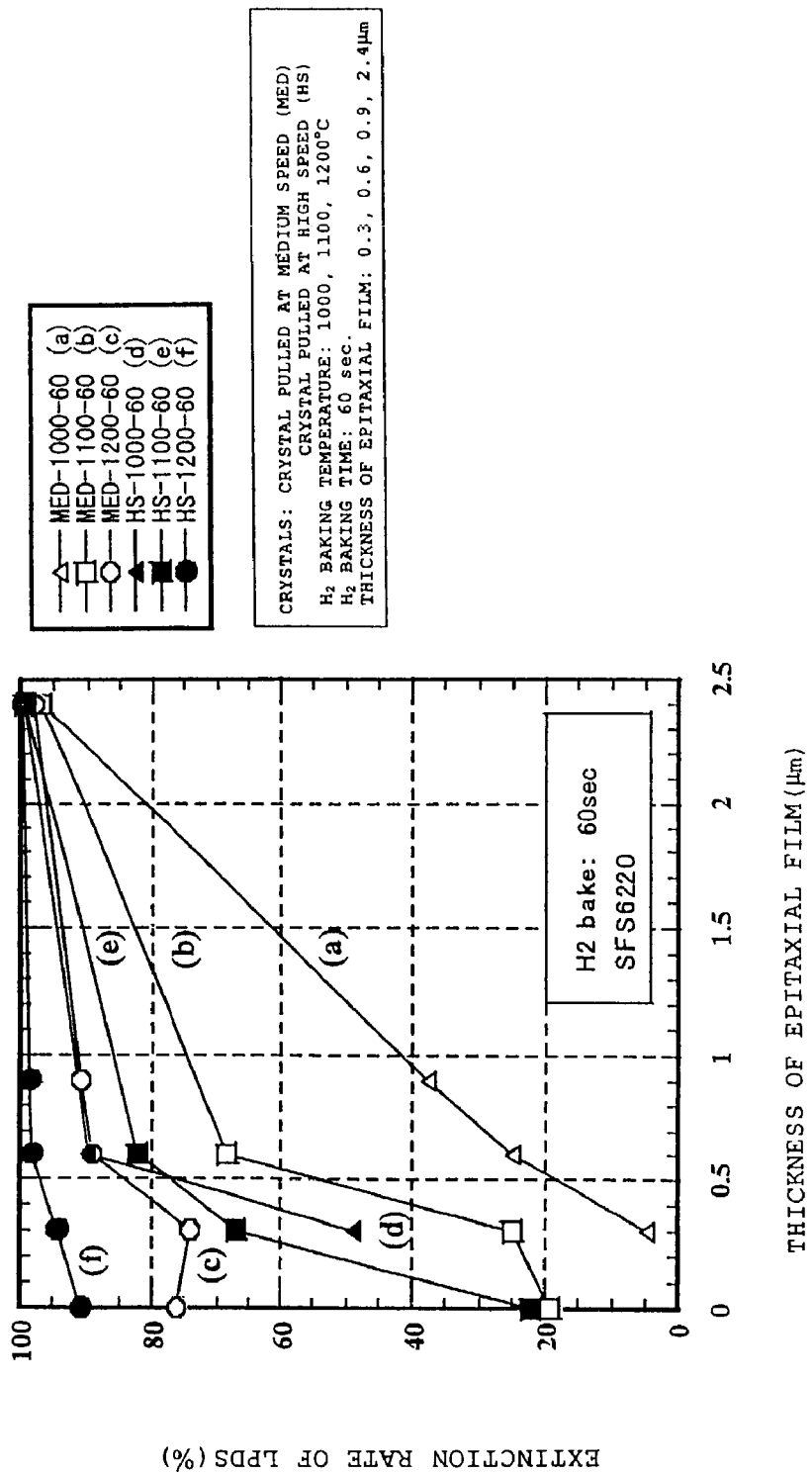
FIG. 5 is a graph showing variation in the extinction rate of LPDs, the variation being induced by a difference in requirements for $H_2$ annealing before epitaxial growth (with a constant processing time of 60 seconds) and a difference between crystals.
Figure 6:
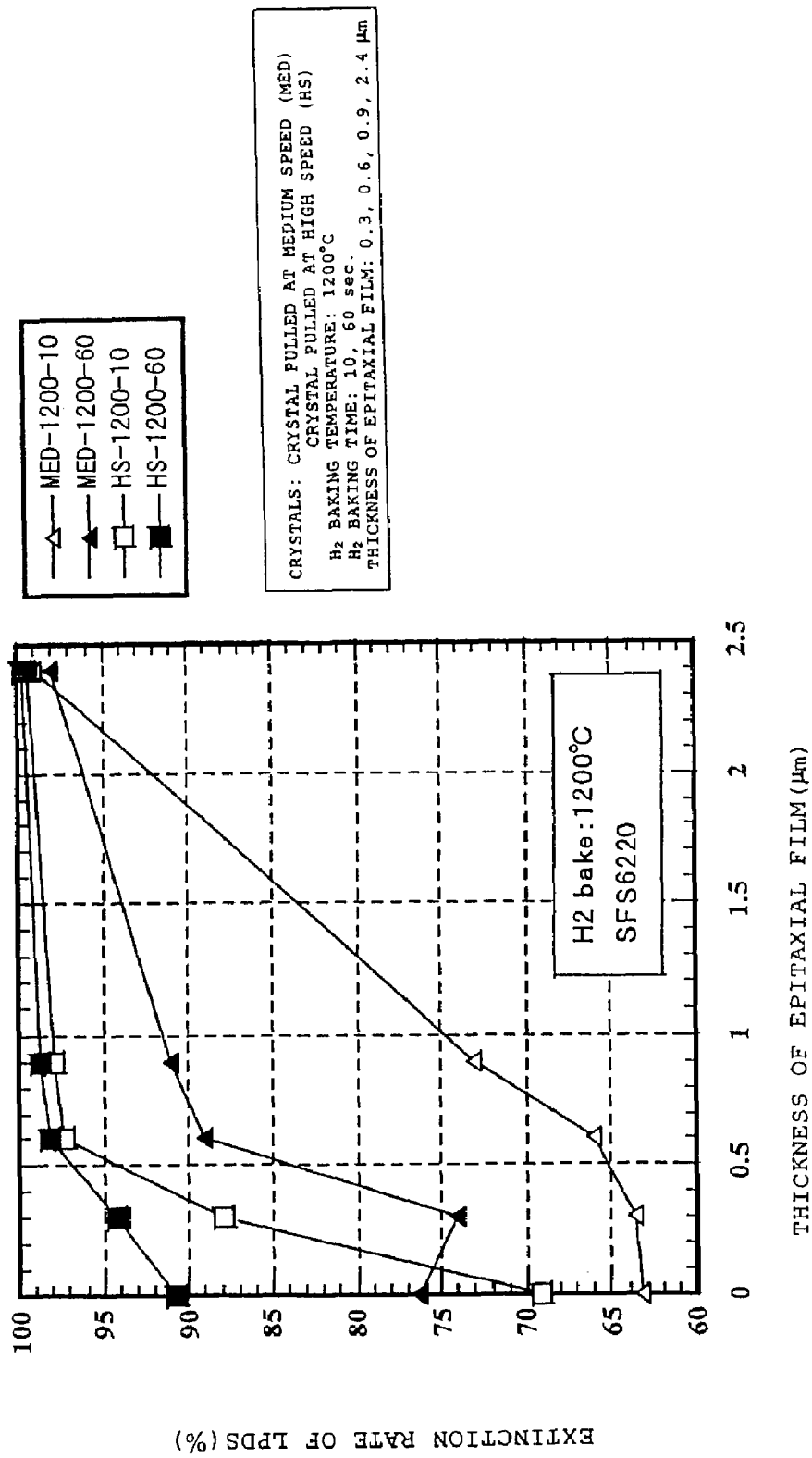
FIG. 6 is a graph showing the extinction rate of LPDs during $H_2$ annealing operation at 1200° C.

FIG. 5 is a graph showing the extinction rate of LPDs obtained when the $H_2$ annealing time was set to 60 seconds while other conditions were the same as those employed in FIG. 4. As is obvious from comparison between the graph shown in FIG. 4 and the graph shown in FIG. 5, the silicon wafers subjected to $H_2$ annealing for 60 seconds all show LPD extinction rates greater than those yielded by the silicon wafers subjected to $H_2$ annealing for 10 seconds. FIG. 6 shows in detail the relationship between the thickness of an epitaxial film and the extinction rate of LPDs obtained when a wafer manufactured through high-speed pulling was subjected to $H_2$ annealing at a temperature of 1200° C. for 60 seconds. It is seen that a good epitaxial silicon wafer of good quality was produced through use of an epitaxial film of 0.3 μm thickness. Conversely, it is understood that an epitaxial wafer having an ultra-thin epitaxial film of 0.3 μm thickness and good quality can be manufactured, by means of subjecting a silicon wafer to an $H_2$ annealing operation at 1200° C. for about 60 seconds before epitaxial growth operation.

FIGS. 7 through 10 are graphs showing the results of measurement of gate oxide integrity (GOI) of respective silicon wafers. The greater the values shown in the graphs, the better results. In the drawings, "H" designates a wafer produced through a high-speed pulling operation (a pulling rate of 1.1 mm/min.), and "M" designates a wafer manufactured through a medium-speed pulling operation (a pulling rate of 0.65 mm/min.). Of numerals suffixed to "H" or "M", the first number denotes annealing temperature (° C.), and the second number denotes annealing time (seconds). Further, the final number denotes the thickness of an epitaxial film (μm). For example, "H1000-60-0.9" (shown in FIG. 8) designates a silicon wafer which has been manufactured through a high-speed pulling operation and annealed at 1000° C. for 60 seconds, with an epitaxial film of 0.9 μm thickness laid on the silicon wafer. Further silicon wafers which final number denotes is 0.0 were only annealed in ambient $H_2$.

In FIGS. 7 through 10, "Reference" provided in the left portion of each drawing designates silicon wafers which were not subjected to $H_2$ annealing for comparison with the silicon wafers mentioned above. Gate oxide integrity (GOI) is expressed in the form of a yield of time-zero dielectric breakdown (TZDB)(%). In this text example, yield of TZDB (%) was determined as follows:

AMOS structure was formed on a silicon wafer, and a polysilicon electrode of 10 mm² was attached to the MOS structure. A voltage was applied to the polysilicon electrode by means of the step-voltage application technique. Here, an oxide film has a thickness of 25 nm, and the GOI of the oxide film was determined at a room temperature (25° C.). Further, an electric current used as criterion for determination was 10 μA. High yield of TZDB silicon wafers which have been determined to be suitable as products through foregoing determination are plotted in the respective graphs. In a case where the proportion of preferable products is determined on the basis of the graphs, silicon wafers having higher yield of TZDB are superior products.

Figure 7:
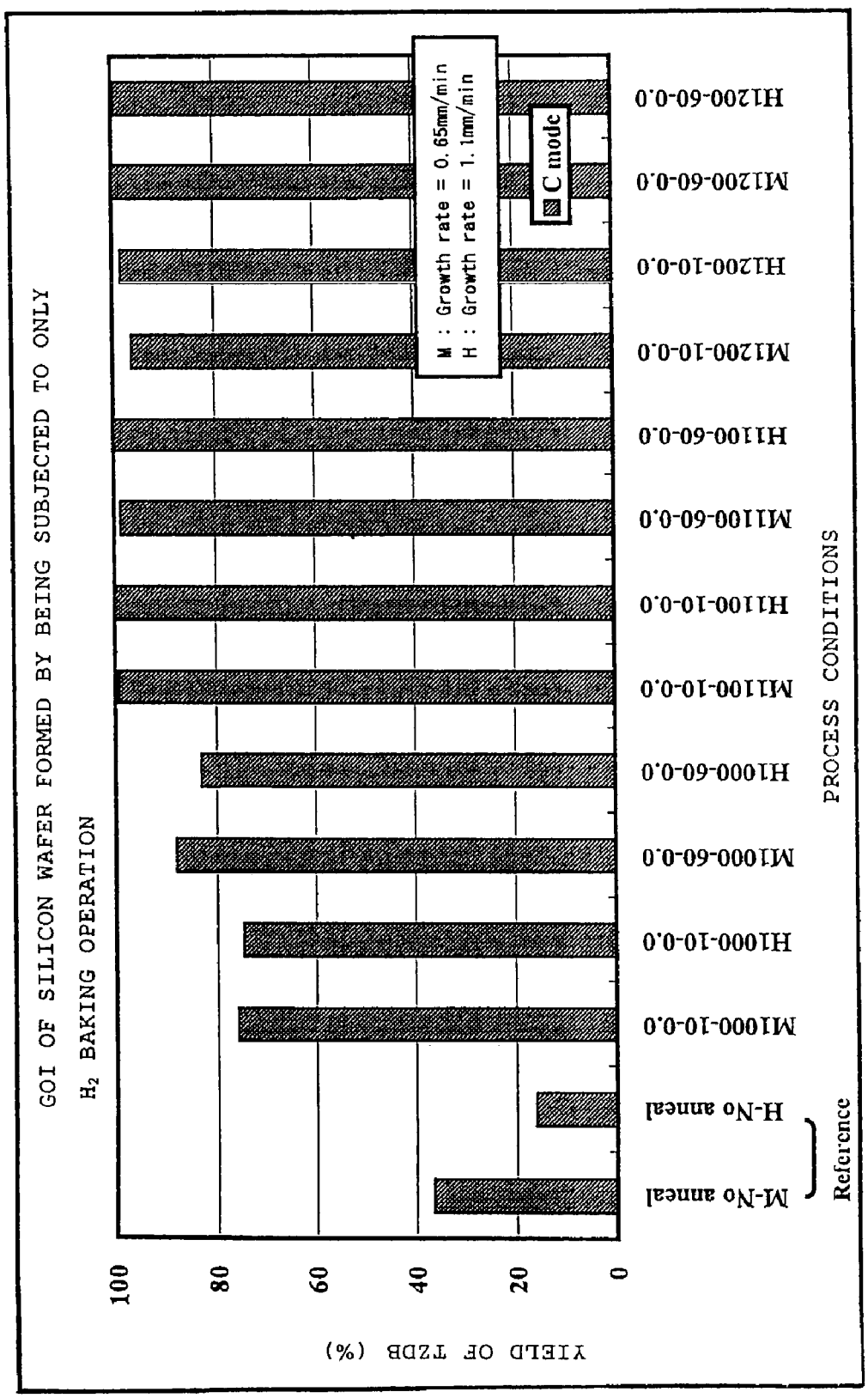
FIG. 7 is a plot showing results of evaluation of gate oxide integrity (GOI) of a silicon wafer annealed in hydrogen ambient before epitaxial growth operation performed while an annealing time and an annealing temperature are varied in a case where only an annealing operation ($H_2$ heat treatment) is effected without involvement of epitaxial growth (GOI is evaluated by means of switching an annealing time between 10 seconds and 60 seconds, and switching an annealing temperature between 1000° C., 1100° C., and 1200° C.)

FIG. 7 shows the GOI evaluation results of silicon wafers, the wafers having been produced by means of only an annealing operation (i.e., $H_2$ heat treatment) without involvement of epitaxial growth, obtained when the GOI values of the silicon wafers were evaluated by means of varying annealing time and annealing temperature. In FIG. 7, there are employed an annealing time of 10 seconds, an annealing time of 60 seconds, an annealing temperature of 1000° C., an annealing temperature of 1100° C., and an annealing temperature of 1200° C.

From FIG. 7, it is evident that the GOI of a silicon wafer can be improved to a certain extent by use of only an $H_2$ annealing operation (i.e., an $H_2$ baking operation). However, in terms of a yield of TZDB, the $H_2$ annealing operation does not satisfy well.

Figure 8:
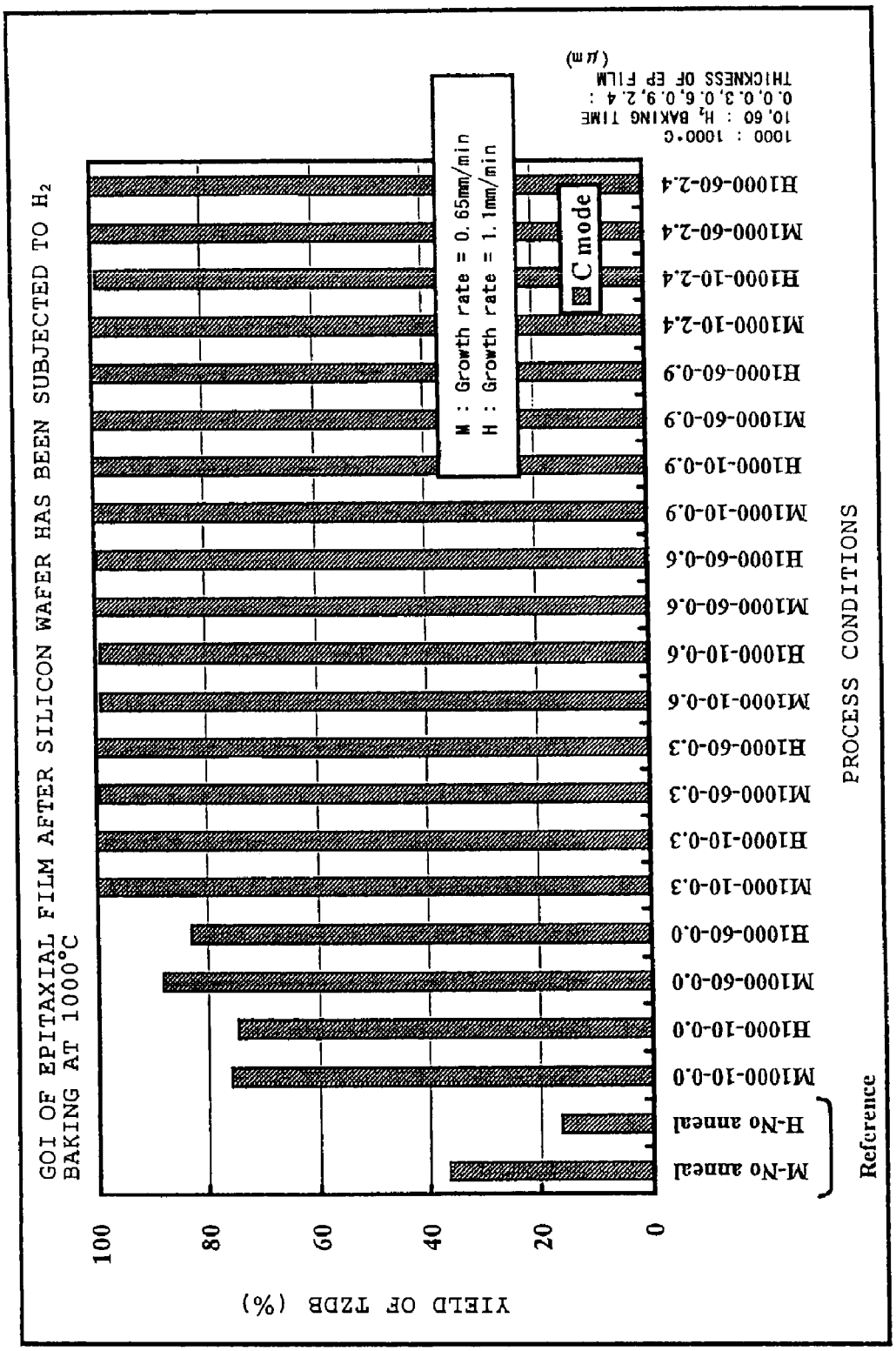
FIG. 8 is a plot showing results of valuation of gate oxide integrity (GOI) of an epitaxial film performed while an annealing temperature is set to 1000° C. and the thickness of an epitaxial film and an annealing time are varied.
Figure 9:
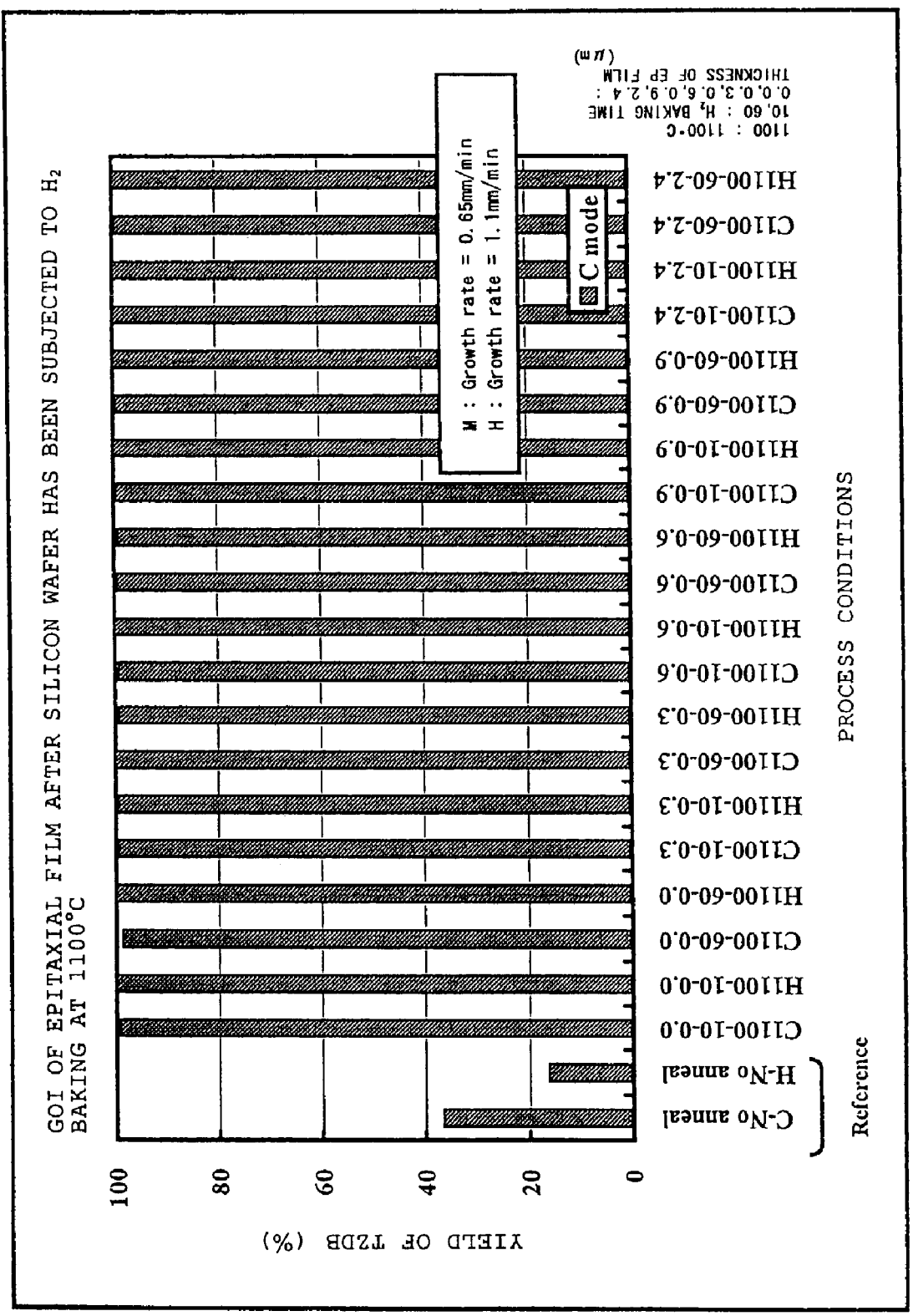
FIG. 9 is a plot showing results of valuation of gate oxide integrity (GOI) of an epitaxial film performed while an annealing temperature is set to 1100° C. and the thickness of an epitaxial film and an annealing time are varied.
Figure 10:
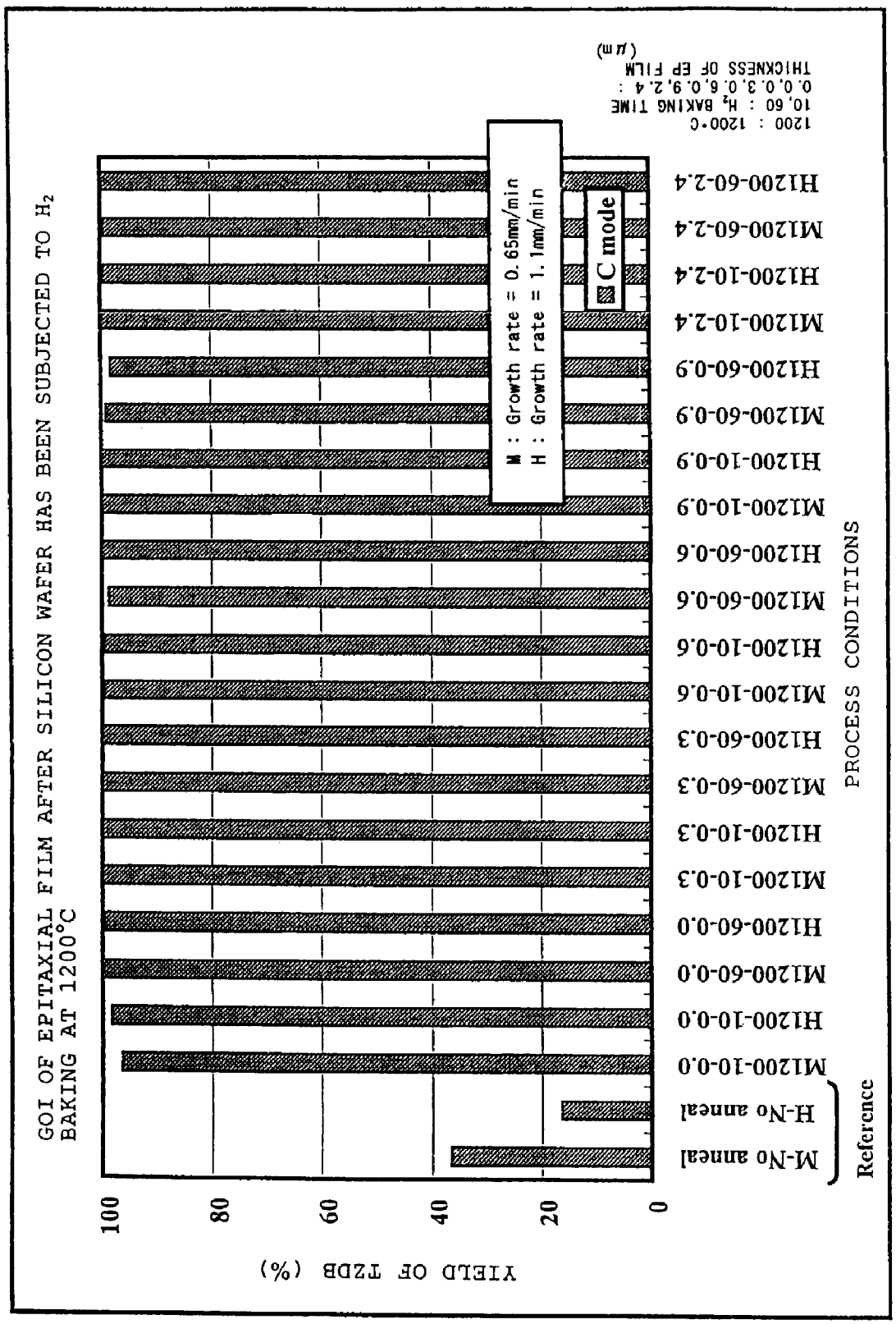
FIG. 10 is a plot showing results of valuation of gate oxide integrity (GOI) of an epitaxial film performed while an annealing temperature is set to 1200° C. and the thickness of an epitaxial film and an annealing time are varied.

FIGS. 8 through 10 show the evaluation results of GOI of silicon wafers obtained while the annealing temperature was varied between 1000° C., 1100° C., and 1200° C. FIG. 8 is a graph showing the evaluation results of GOI of silicon wafers obtained while epitaxial film thickness has been varied form 0.0 μm to 2.4 μm using crystal pulled at medium speed to a crystal pulled at a high speed.

These results show that a yield of TZDB is considerably improved, by means of forming an epitaxial layer on a silicon wafer after having subjected the silicon wafer to annealing. Further, the epitaxial silicon wafer manufactured according to the present invention shows a superior GOI result even when an epitaxial film has a thickness of 0.3 μm. An epitaxial silicon wafer showing a superior GOI result even when the epitaxial film has a thickness of 0.3 μm has not been obtainable in the background art. In a case where further another epitaxial film is formed on the epitaxial silicon wafer having epitaxial film through epitaxial growth, the second epitaxial film is laid on a sturdy epitaxial film of 0.3 μm, the film showing a superior GOI result. The epitaxial silicon wafer can be equivalent to a conventional epitaxial film.

In consideration of the foregoing results, it is understood that the following can be derived.

A silicon wafer, which is formed from a crystal produced through a high-speed pulling operation, was subjected to $H_2$ baking at 1200° C. for 10 seconds. Further, an epitaxial film was formed on the silicon wafer to a thickness of 0.3 μm. The number of LPDs (more than 0.12 μm) detected on the surface of the resultant epitaxial silicon wafer was 90 LPDs/wafer (i.e., 0.3 LPDs/cm² or less). The disappearance rate of a LPD on surface of an epitaxial silicon wafer reached about 90%.

The silicon wafer, which has been produced by means of an annealing at 1200° C. for 60 seconds, has LPDs in the number of about 80 LPDs/wafer or less (i.e. 0.25 LPDs/cm² or less). After an epitaxial film has been formed on the silicon wafer to a thickness of 0.6 μm, the resultant epitaxial silicon wafer has 30 LPDs/wafer or less (i.e., 0.1 LPDs/cm² or less). The epitaxial silicon wafer, which has been produced by means of an annealing at 1200° C. for 10 seconds, has 30 LPDs/wafer or less (i.e., 0.1 LPDs/cm² or less), as well.

In order to produce an epitaxial silicon wafer having 80 LPDs/wafer or less from a crystal produced by means of a medium-speed pulling operation, a silicon wafer must be annealed at 1200° C. for 60 seconds, and an epitaxial film must be formed on the silicon wafer to a thickness of 0.9 μm, as in the case of the background art. Further, in order to produce an epitaxial silicon wafer having 30 LPDs/wafer or less, a silicon wafer must be annealed at 1200° C. for 60 seconds, and an epitaxial film must be formed on the silicon wafer to a thickness of 2 μm, as in the case of the background art.

From the above described results, the following can be derived:

A silicon wafer having COPs of 130 nm or less (an LSTD (laser scattering tomography defect) density of $1\times10^6$ defects/cm³ or more) is suitable for use as a substrate for use in producing an epitaxial wafer. A new application is provided for a single crystal produced through a high-speed pulling operation.

COP's pits in the surface of a silicon wafer are converted into sufficiently-smooth recesses by $H_2$ baking. Therefore, even when a thin epitaxial film is formed on the silicon wafer to a thickness of 0.3 μm, the recesses do not affect the thin epitaxial film. In other words a LPD is not detected on surface of the EP layer upper COP site on a silicon wafer surface.

A silicon wafer as a silicon substrate for epitaxial growth is annealed at an $H_2$ baking temperature of 1200° for preferably 10 seconds or more or for less than 60 seconds.

There can be produced an epitaxial wafer having an epitaxial film ranging from 0.3 μm to 2 μm and which is not affected by COPs.

A specific report about the gate oxide integrity (GOI) of a thin epitaxial film formed from a crystal having a small COPs has not been available thus far. It can be ascertained that, without regard to an $H_2$ baking temperature, a yield of TZDB is improved by forming an epitaxial film of 0.3 μm.

As has been described above, the present invention provides a method of manufacturing an epitaxial silicon wafer and an epitaxial silicon wafer manufactured thereby, and there can be manufactured an epitaxial silicon wafer which is less susceptible to the shape of COPs and exhibits superior gate oxide integrity (GOI) when a semiconductor device is fabricated on the silicon wafer.

An epitaxial silicon wafer according to the present invention is suitable for fabricating particularly a semiconductor device having a comparatively-shallow active region or a device requiring an improved latch-up characteristic.

The method of manufacturing an epitaxial silicon wafer according to the present invention enables shortening of the total time required for manufacturing processes, which in turn enables manufacture of an low-cost epitaxial silicon wafer.

What is claimed is:

1. A method of manufacturing an epitaxial silicon wafer, comprising:
  a silicon ingot manufacturing step of pulling a silicon ingot under a pulling condition in which an LSTD density assumes a value of 1×10⁶ defects/cm³ or more so as to obtain shallow recessed pits on a surface of a silicon wafer, when the silicon ingot is manufactured by Czochralski technique;
  a step of slicing a silicon wafer off the silicon ingot manufactured in the silicon ingot manufacturing step to obtain the silicon wafer having the shallow recessed pits on the surface of the silicon wafer;
  an annealing step for smoothing the surface of the silicon wafer by annealing the sliced off silicon wafer under an annealing condition in which an annealing temperature is 1000° C. or more; whereby the shallow recessed pits on the surface of the silicon wafer are converted into gently-sloped, shallow and wider recesses; and
  an epitaxial layer growing step of growing an epitaxial layer on the surface of the smoothed silicon wafer, the grown epitaxial layer being an extremely thin film having a thickness sufficient for causing LPDs on a surface of the grown epitaxial layer to be extinct.

2. A method of manufacturing an epitaxial silicon wafer, comprising:
  a silicon ingot manufacturing step of pulling a silicon ingot under a pulling condition in which a COP size becomes 130 nm or less or a perfect crystal so as to obtain shallow recessed pits on a surface of a silicon wafer, when the silicon ingot is manufactured by Czochralski technique;
  a step of slicing a silicon wafer off the silicon ingot manufactured in the ingot manufacturing step to obtain the silicon wafer having the shallow recessed pits on the surface of the silicon wafer;
  an annealing step for smoothing the surface of the silicon wafer by annealing the sliced off silicon wafer under an annealing condition in which an annealing temperature is 1000° C. or more, whereby the shallow recessed pits on the surface of the silicon wafer are converted into gently-sloped, shallow and wider recesses; and
  an epitaxial layer growing step of growing an epitaxial layer on the surface of the smoothed silicon wafer, the grown epitaxial layer being an extremely thin film having a thickness sufficient for causing LPDs on a surface of the grown epitaxial layer to be extinct.

3. The method of manufacturing an epitaxial silicon wafer as claimed in claim 1, wherein the pulling condition in the ingot manufacturing step comprises rapidly cooling the silicon ingot.

4. The method of manufacturing an epitaxial silicon wafer as claimed in claim 2, wherein the pulling condition in the ingot manufacturing step comprises rapidly cooling the silicon ingot.

5. The method of manufacturing an epitaxial silicon wafer as claimed in claim 3, wherein the pulling condition in the ingot manufacturing step comprises further doping the silicon ingot with nitrogen.

6. The method of manufacturing an epitaxial silicon wafer as claimed in claim 4, wherein the pulling condition in the ingot manufacturing step comprises further doping the silicon ingot with nitrogen.

7. The method of manufacturing an epitaxial silicon wafer as claimed in claim 1, wherein the annealing step and the epitaxial layer growing step are performed under isothermal and isobaric conditions.

8. The method of manufacturing an epitaxial silicon wafer as claimed in claim 2, wherein the annealing step and the epitaxial layer growing step are performed under isothermal and isobaric conditions.

9. The method of manufacturing an epitaxial silicon wafer as claimed in claim 1, wherein the annealing step comprises a step of smoothing the surface of the silicon wafer by annealing the sliced off silicon wafer under an annealing condition in which an annealing temperature is within a range of 1000° C. to 1200° C., whereby the shallow recessed pits on the surface of the silicon wafer are converted into gently-sloped shallow and wide recesses.

10. The method of manufacturing an epitaxial silicon wafer as claimed in claim 2, wherein the annealing step comprises a step of smoothing the surface of the silicon wafer by annealing the sliced off silicon wafer under an annealing condition in which an annealing temperature is within a range of 1000° C. to 1200° C., whereby the shallow recessed pits on the surface of the silicon wafer are converted into gently-sloped shallow and wide recesses.

11. The method of manufacturing an epitaxial silicon wafer as claimed in claim 1, wherein the annealing step comprises a step of smoothing the surface of the silicon wafer by annealing the sliced off silicon wafer under an annealing condition in which an annealing temperature is within a range of 1000° C. to 1200° C. and an annealing time is within a range of 10 seconds to 60 seconds, whereby the shallow recessed pits on the surface of the silicon wafer are converted into gently-sloped, shallow and wide recesses.

12. The method of manufacturing an epitaxial silicon wafer as claimed in claim 2, wherein the annealing step comprises a step of smoothing the surface of the silicon wafer by annealing the sliced off silicon wafer under an annealing condition in which an annealing temperature is within a range of 1000° C. to 1200° C. and an annealing time is within a range of 10 seconds to 60 seconds, whereby the shallow recessed pits on the surface of the silicon wafer are converted into gently-sloped, shallow and wide recesses.

13. The method of manufacturing an epitaxial silicon wafer as claimed in claim 1, wherein the annealing temperature in the annealing step is set to an epitaxial growth temperature.

14. The method of manufacturing an epitaxial silicon wafer as claimed in claim 2, wherein the annealing temperature in the annealing step is set to an epitaxial growth temperature.

15. The method of manufacturing an epitaxial silicon wafer as claimed in claim 1, wherein the annealing step and the epitaxial layer growing step are performed incessantly through a round of processes in a same epitaxial growth furnace.

16. The method of manufacturing an epitaxial silicon wafer as claimed in claim 2, wherein the annealing step and the epitaxial layer growing step are performed incessantly through a round of processes in an epitaxial growth furnace.

17. The method of manufacturing an epitaxial silicon wafer as claimed in claim 1, wherein the extremely thin film formed in the epitaxial layer growing step has a thickness within a range of 0.3 μm to 2 μm.

18. The method of manufacturing an epitaxial silicon wafer as claimed in claim 2, wherein the extremely thin film formed in the epitaxial layer growing step has a thickness within a range of 0.3 μm to 2 μm.

19. The method of manufacturing an epitaxial silicon wafer as claimed in claim 1, wherein the extremely thin film formed in the epitaxial layer growing step has a thickness smaller than 0.4 μm.

20. The method of manufacturing an epitaxial silicon wafer as claimed in claim 2, wherein the extremely thin film formed in the epitaxial layer growing step has a thickness smaller than 0.4 μm.

21. A method of manufacturing an epitaxial silicon wafer, comprising:

a silicon ingot manufacturing step of pulling a silicon ingot under a pulling condition in which an LSTD density assumes a volume of $1\times10^6$ defects/cm$^3$ or more so as to obtain shallow recessed pits on a surface of a silicon wafer, when the silicon ingot is manufactured by Czochralski technique;

a step of slicing a silicon wafer having the shallow recessed pits on the surface of the silicon wafer off the silicon ingot manufactured in the silicon ingot manufacturing step;

an annealing step of smoothing the surface of the silicon wafer by annealing the sliced off silicon wafer under an annealing condition in which an annealing temperature is within a range of 1000° C. to 1200° C., whereby the shallow recessed pits on the surface of the silicon wafer are converted into gently-sloped, shallow and wide recesses; and an epitaxial layer growing step of growing an epitaxial layer on the surface of the smoother silicon wafer, the grown epitaxial layer consisting of an extremely thin film having a thickness smaller than 0.4 μm sufficient for causing LPDs on a surface of the grown epitaxial layer to disappear, the epitaxial layer growing step being performed continuously with the annealing step in a single epitaxial growth furnace.

22. A method of manufacturing an epitaxial silicon wafer, comprising:

a silicon ingot manufacturing step of pulling a silicon ingot under a pulling condition in which a COP size becomes 130 nm or less or a perfect crystal so as to obtain shallow recessed pits on a surface of a silicon wafer, when the silicon ingot is manufactured by Czochralski technique;

a step of slicing a silicon wafer having the shallow recessed pits on the surface of the silicon off the silicon ingot manufactured in the silicon ingot manufacturing step;

an annealing step of smoothing the surface of the silicon wafer by annealing the sliced off silicon wafer under an annealing condition in which an annealing temperature is within a range of 1000° C. to 1200° C., whereby the shallow recessed pits on the surface of the silicon wafer are converted into gently-sloped, shallow and wide recesses; and an epitaxial layer growing step of growing an epitaxial layer on the surface of the smoothed silicon wafer, the grown epitaxial layer consisting of an extremely thin film having a thickness smaller than 0.4 μm sufficient for causing LPDs on a surface of the grown epitaxial layer to be extinct, the epitaxial layer growing step being performed incessantly with the annealing step in an epitaxial growth furnace.

* * * * *